(12) United States Patent
Huang

(10) Patent No.: US 10,020,069 B2
(45) Date of Patent: Jul. 10, 2018

(54) FULLY DIFFERENTIAL OUTPUT SWING FOR ANALOG ARRAY BASED CHARGE MODE READOUT USED IN A CMOS IMAGE SENSOR

(71) Applicant: Forza Silicon Corporation, Pasadena, CA (US)

(72) Inventor: Steven Huang, Pasadena, CA (US)

(73) Assignee: Forza Silicon, Inc., Pasadena, CA (US)

( * ) Notice: Subject to any disclaimer, the term of this patent is extended or adjusted under 35 U.S.C. 154(b) by 111 days.

(21) Appl. No.: 14/875,511

(22) Filed: Oct. 5, 2015

(65) Prior Publication Data

US 2016/0099269 A1    Apr. 7, 2016

Related U.S. Application Data

(60) Provisional application No. 62/059,848, filed on Oct. 3, 2014.

(51) Int. Cl.
| | |
|---|---|
| *H01L 27/00* | (2006.01) |
| *G11C 27/02* | (2006.01) |
| *H04N 5/378* | (2011.01) |
| *H03F 3/45* | (2006.01) |

(52) U.S. Cl.
CPC ....... *G11C 27/026* (2013.01); *H03F 3/45475* (2013.01); *H04N 5/378* (2013.01); *H03F 2203/45134* (2013.01); *H03F 2203/45156* (2013.01); *H03F 2203/45171* (2013.01); *H03F 2203/45514* (2013.01); *H03F 2203/45551* (2013.01)

(58) Field of Classification Search
CPC ...... H04N 5/3698; H04N 5/374; H04N 5/378; H01L 27/14609; H01L 27/14643
USPC ............... 250/208.1, 214 R, 214 A, 214 LA, 250/214 SW; 348/320, 322
See application file for complete search history.

(56) References Cited

U.S. PATENT DOCUMENTS

2016/0100116 A1*  4/2016  Mesgarini ............ H04N 5/3745
                                                         348/300

OTHER PUBLICATIONS

Steven Huang, David Estrada, Daniel Van Blerkom and Barmak Mansoorian, "Design of Analog Readout Circuitry with Front-end Multiplexing for Column Parallel Image Sensors," CMOS Image Sensor (Visible), Technical Papers, Jun. 1, 2013.

* cited by examiner

*Primary Examiner* — Kevin Pyo

(57) ABSTRACT

Disclosed herein are novel charge mode readout circuits and associated methods of signal processing. The devices and methods of the invention allow for the improved processing of stored signals by a charge mode readout amplifier, wherein the readout level may be shifted to a desired range and wherein a fully differential output swing may be imparted. The invention advantageously employs a single pair of capacitors to serve the dual roles of modulating amplifier gain and level shifting the output.

4 Claims, 3 Drawing Sheets

FULLY DIFFERENTIAL OUTPUT SWING FOR ANALOG ARRAY BASED CHARGE MODE READOUT USED IN A CMOS IMAGE SENSOR

CROSS-REFERENCE TO RELATED APPLICATIONS

This application claims the benefit of priority to U.S. Provisional Application Ser. No. 62/059,848, entitled "Fully Differential Output Swing for Analog Array Based Charge Mode Readout used in a CMOS Image Sensor," filed Oct. 3, 2014, the contents of which are hereby incorporated by reference.

STATEMENT REGARDING FEDERALLY SPONSORED RESEARCH OR DEVELOPMENT

Not applicable

REFERENCE TO SEQUENCE LISTING, A TABLE, OR A COMPUTER PROGRAM LISTING COMPACT DISK APPENDIX

Not Applicable

BACKGROUND OF THE INVENTION

Currently, many image sensor pixel array designs employ a charge mode readout ("CMR") architecture. Sample and reset values from individual pixels in a selected CMOS image sensor pixel array row are simultaneously read out through individual columns to a line memory, where they are stored on sample-and-hold capacitors until column readout. Upon column readout, stored sample and reset signals are routed to a switched capacitor amplifier and the resulting voltage signals output by this buffering amplifier are input to an analog-to-digital converter ("ADC"). An exemplary CMR readout design is presented in FIG. 1.

High-performance amplifiers are usually required in CMR's due to their poor feedback factor and high speed requirements, which increases the image sensor readout power usage drastically. In fact, the CMR amplifiers have become one of the most power-hungry components in today's CMOS image sensors.

One prior art solution which reduces the power consumption of the buffering amplifier is the use of a level-shifting circuit in the buffering stage, for example as described by S. Huang, et al., "Design of Analog Readout Circuitry with Front-End, Multiplexing for Column Parallel Image Sensors", IEEE Int. Image Sensor Workshop, 7.08, June 2013. For example, a DAC-driven capacitive level shifting circuit may be used. An exemplary level-shifting CMR design is presented in FIG. 2. The level-shifting circuit imparts a fully differential output voltage swing to the amplifier, improving signal resolution, and also allowing the use of a lower power amplifier. However, this solution has various shortcomings:

1) the feedback factor is reduced by the feed forward capacitors present in the level shifting DAC, and higher power consumption is required;
2) the level-shifting circuit introduces more components and increases the area of the readout circuitry; and
3) the amplifier must be unity gain stable in the reset phase of the readout process;

During the reset phase, the amplifier output is sampled onto the DAC capacitors in unity gain mode. The output needs to settle with adequate precision to attain the desired signal. This requirement creates a problem because using a typical two-stage op-amp with compensation capacitors, such capacitors must be sized such that the op-amp is stable for both the gain phase (which has a higher loop gain) and the reset phase (with unity gain). In order to reconcile these requirements, an op-amp with lower bandwidth is used in order to stay stable during the unity gain phase, requiring higher power consumption.

Accordingly, there is a need in the art for improvements to the prior art level-shifting CMR solution that overcome the shortcomings of such designs while maintaining the advantages thereof. Presented herein are novel circuits and associated methods which improve upon the level-shifting CMR readout designs of the prior art.

SUMMARY OF THE INVENTION

Presented herein is a novel CMR readout stage configuration wherein a single capacitor serves as both a level-shifting capacitor and as a feedback capacitor of the amplifier. During read mode, each output of the differential amplifier is fed back across a capacitor. During reset mode, the same capacitor also charged to a desired level by a voltage source, for example a DAC voltage output. This design eliminates the need for the op-amp to be unity gain stable during the reset phase, allowing selection of components optimized only for the gain phase.

DESCRIPTION OF DRAWINGS

In FIG. 1, pair n (101 and 102), pair n+1 (103 and 104), and pair $n_m$ (105 and 106) are depicted. Each capacitor pair is connected to column output lines (e.g. 107 and 108) from which photointegration signals and reset signals are received from selected pixels during pixel readout. When sample and hold capacitor pair n is selected for readout, switches 111 and 112 are closed, connecting each of these capacitors to the charge mode readout out circuit. Opening of switch 111 transfers the charge stored on capacitor 101 to one of the inputs 113 of a switched capacitor amplifier 115. Opening of switch 112 transfers the charge stored on capacitor 102 to the opposing input 114 of the switched capacitor amplifier 115. Each amplifier output line (117 and 118) is branched. On each output line, a first branch (119 and 120) feeds output signal back across a capacitor (121 and 122) to modulate the gain of the amplifier. On each output line, a branch (123 and 124) connects to an input of a fully differential ADC (116).

In FIG. 3, pair n (301 and 302), pair n+1 (303 and 304), and pair $n_m$ (305 and 306) are depicted. Each capacitor pair is connected to column output lines (e.g. 307 and 308) from which photointegration signals and reset signals are received from selected pixels during pixel readout. During a readout phase, pairs of sample and hold capacitors in the array may be selected for readout and their signals may be connected to opposing inputs of the differential amplifier for input to an ADC. For example, when pair n (301 and 3012) is selected for readout, switches 311 and 312 are closed, connecting each of these capacitors to the charge mode readout circuit. Opening of switch 311 transfers the charge stored on capacitor 301 to one of the inputs 313 of a switched capacitor amplifier 315. Opening of switch 312 transfers the charge stored on capacitor 302 to the opposing input 314 of the switched capacitor amplifier 315. Each amplifier output line (317 and 318) is branched. On each output line, a first branch (319 and 320), under control of a switch (325 and 326) feeds output signal back across a capacitor (331 and 332) to modulate the gain of the amplifier. On each amplifier output line, a second branch (323 and 324) connects to an input of a fully differential ADC (316). The circuit of FIG. 3 is configured such that it can operate in a second mode, which is a reset mode. In this mode, all switches connecting the amplifier to the array of sample and hold capacitors are opened, for example switches 311 and 312 may be opened to take 301 and 302 off line. Switches 337 and 338 are closed, such that a first plate of each of capacitors 331 and 332 is connected to a voltage source, for example, the differential outputs of a DAC (330) as depicted in FIG. 3. In this reset mode, switches 333 and 334 are closed, connecting the second plate of each capacitor (331 and 332) to a voltage source (335 and 336).

DETAILED DESCRIPTION OF THE INVENTION

Figure 2:
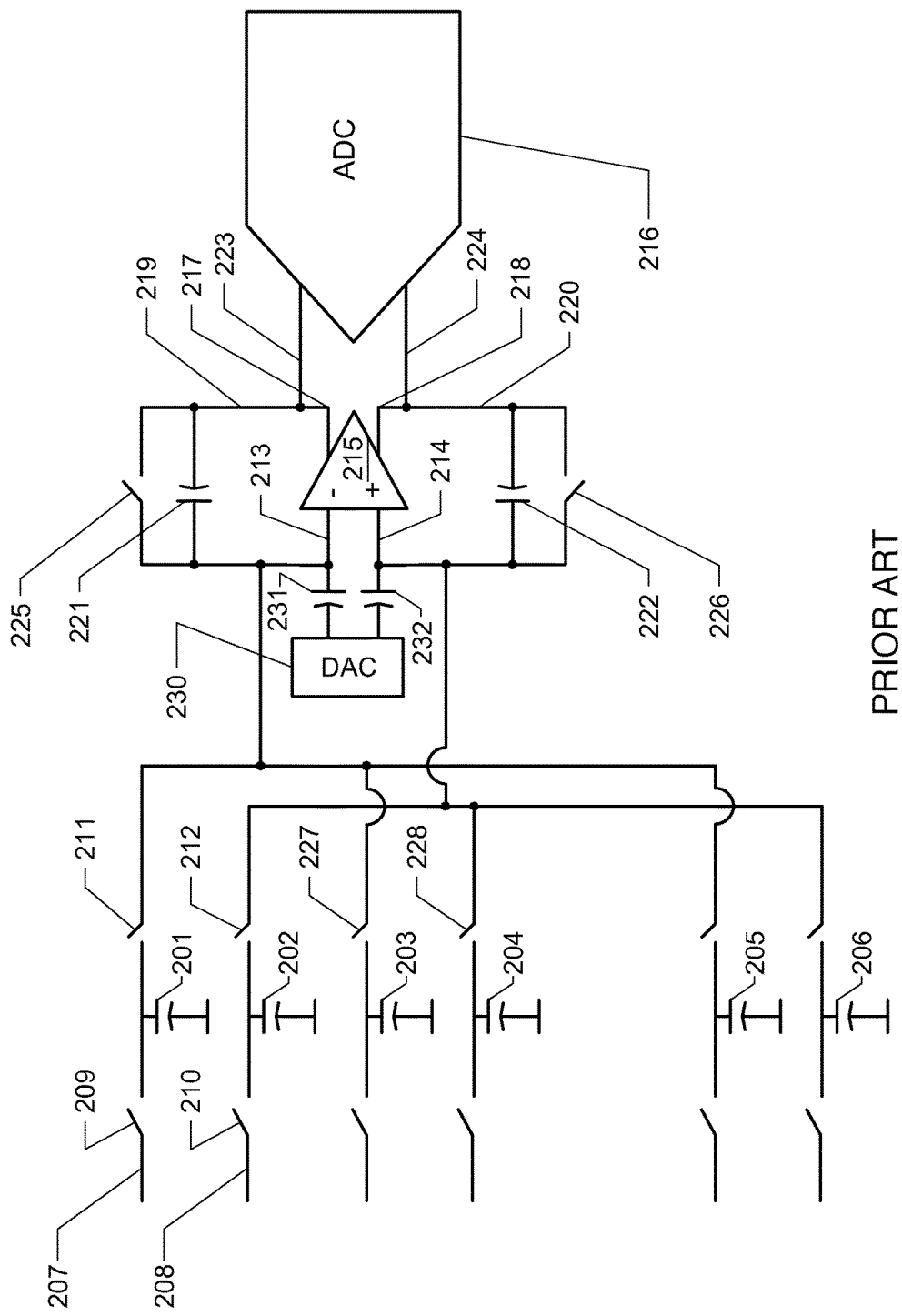
FIG. 2 depicts a prior art charge mode readout stage having a level shifting circuit. As in FIG. 1, this circuit comprises an array of m sample and hold capacitor pairs in connection with a charge mode readout stage. This design additionally comprises a DAC-driven capacitive level shifting circuit, comprising a DAC (230), and capacitors 231 and 232. Capacitors 231 and 232 output to the amplifier inputs 113 and 114, imparting fully differential output voltage swing to the amplifier.
Figure 3:
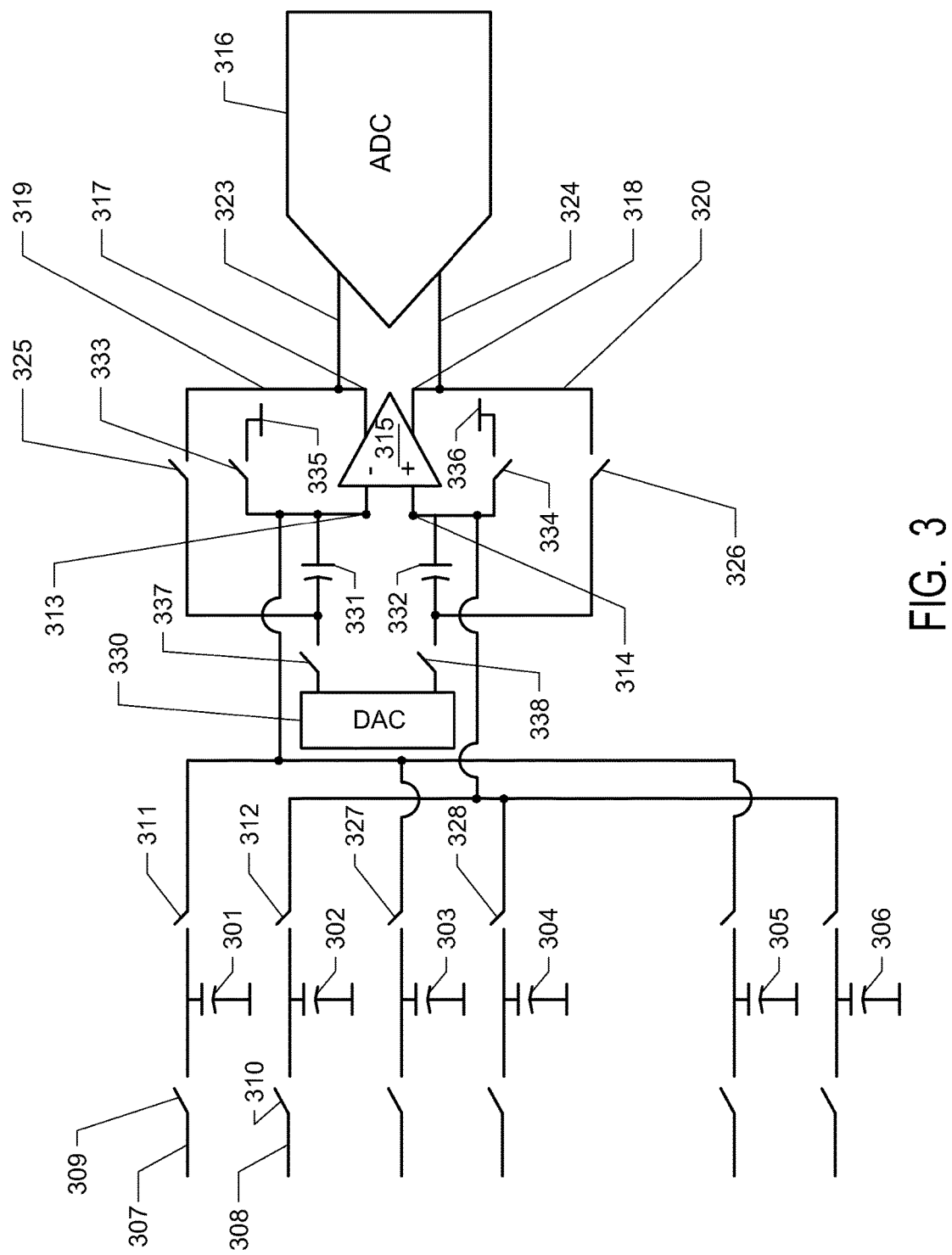
FIG. 3 depicts an exemplary charge mode readout stage of the present invention. An array of m sample and hold capacitor pairs is present.

An exemplary improved level-shifting CMR readout stage of the invention is presented in FIG. 3. Like the circuit of FIG. 2, this circuit advantageously incorporates a DAC-driven capacitive level shifting circuit. The prior art circuit of FIG. 2 comprises two pairs of capacitors. The first pair (221 and 222) provides amplifier feedback, while the second pair (231 and 232) enables DAC-driven level shifting. The circuit design of FIG. 3 improves upon the design depicted in FIG. 2 in that on each line, a single capacitor (332 and 333) serves as the negative feedback capacitor and also provides the level shifting function.

In operation, the circuit functions as follows. During readout phase, pairs of sample-and-hold capacitors in the array are selected sequentially for readout, each pair storing a photointegration signal and a reset signal received from a pixel. When capacitor pair 301 and 302 is selected for readout, switches 311 and 312 are closed, connecting each of the sample and hold capacitors to an input line (313 and 314) of the amplifier (315). Upon establishment of such connection, the charge stored on sample-and-hold capacitor 301 is transferred to capacitor 331, and the charge stored on capacitor 302 is transferred to capacitor 332. During read mode, switches 325 and 326 are closed to create a feedback loop between the amplifier outputs 319 and 320 and inputs 313 and 314, across capacitors 331 and 332. After a settling phase, the amplifier output is read by the ADC. Correlated double sampling is performed by subtracting the reset signal from the photointegration signal and the resulting differential is converted to a digital signal, which may be output from the ADC for storage or further processing.

After the readout phase is complete, a reset phase is initiated in order to prepare the charge readout stage to read the next-in-line pair of sample and hold capacitors. In the reset phase, the previously selected sample-and-hold capacitors 301 and 302 are taken offline by opening switches 311 and 312. The amplifier feedback lines 319 and 320 are also taken offline by opening switches 325 and 326. The capacitors 331 and 332 are then charged to a desired level by connecting each plate of each capacitor to a voltage source. The first plate of each capacitor can be connected to a voltage source by closing switched 337 and 338. The second plate of each capacitor can be connected to a voltage source (335 and 336) by closing switches 333 and 334.

Figure 1:
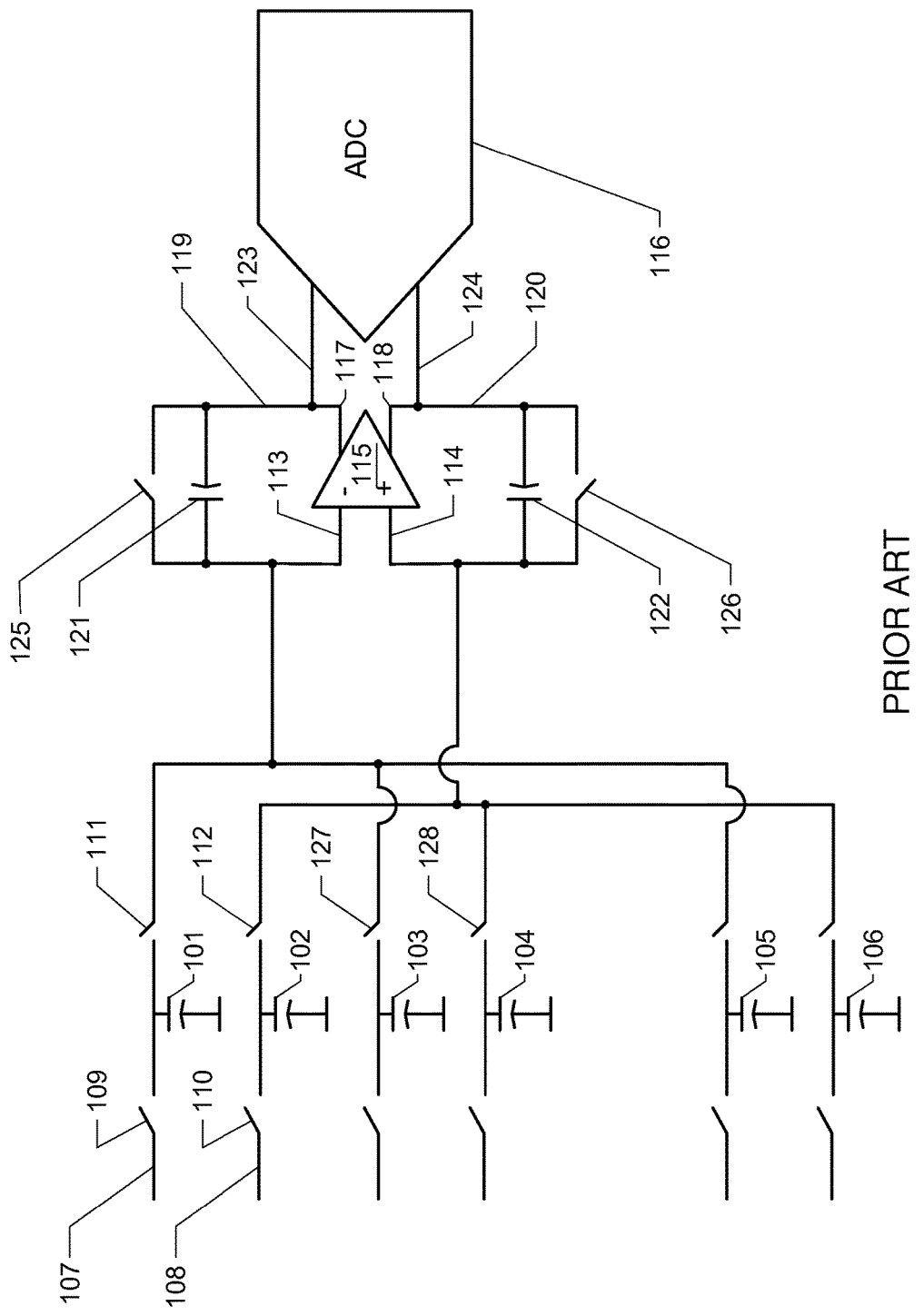
FIG. 1 depicts a prior art charge mode readout stage. An array of m sample and hold capacitor pairs is present.

In typical charge mode readout circuits, the gain capacitors are cleared of charge during the reset mode by shorting them, for example in FIG. 1 by closing switches 125 and 126. In contrast, in the charge mode readout circuit of the present invention, the gain capacitors are charged to a desired level during the reset mode by connecting their plates to voltage sources. This charging of the gain capacitors allows them to be set at a specific level to improve signal parameters. In one embodiment, the specific level is selected in order to impart fully differential output swing to the amplifier output. In another embodiment, the specific level is selected to level shift the amplifier output to a desired range, for example a range matched to the optimal range of the amplifier and/or ADC. In one embodiment, the voltage sources connected to the capacitor plates are fixed voltage sources. In another embodiment, the voltage sources connected to the capacitor plates are variable, controllable voltage sources, allowing tuning of the circuit to specific operating ranges. For example, in one embodiment, the voltage sources used to charge the capacitor comprise differential voltage outputs from a digital to analog converter (DAC). The DAC may be under the control of control elements which respond to measured signals within the circuit and which keep the amplifier output centered around a common mode voltage or a desired centerpoint. In an alternative embodiment, the voltage sources are asymmetrical in magnitude.

After completion of the reset phase, once the capacitors are charged to the desired level by the applied voltages, the system is ready to read the next pair of sample-and-hold capacitors in the array, e.g. 303 and 304 may be read after reading of 301 and 302.

This novel design allows a single capacitor to perform two functions, providing amplifier feedback and level shifting. This design imparts multiple advantages over the prior art level-shifting CMR stage:

1) the feedback factor is increased, improving the gain of the amplifier and reducing amplifier power consumption;
2) the use of one capacitor instead of two shrinks the area of the CMR readout stage;
3) the amplifier is not required to operate in unity gain mode, reducing design, fabrication, and operation constraints.

In one embodiment, the invention comprises a circuit wherein a single capacitor serves as an amplifier feedback capacitor and also as the capacitive element of a DAC-driven capacitive level shifting circuit. In one embodiment, the invention comprises the circuit of FIG. 3.

For convenience, the invention has been described with respect to the readout of pixels in a CMOS image sensor array. However, it will be understood that the invention is not limited to use in CMOS image sensor arrays, and may be implemented in any device to achieve readout of multiple channels via a shared amplifier. Additionally, it will be understood that the readout circuits and associated methods of the invention are not limited to CMOS image sensors and may be implemented in any device, including other types of image sensors and non-image sensors, wherein multiple data signals are read out using an amplifier.

Example 1

To realize next-generation highly realistic sensation broadcasting systems, the research and development of 8K ultrahigh-definition television (UHDTV) systems have been promoted. To reduce the size of the camera, single-chip imaging is a promising approach, and a compact single-chip 8K camera that weighs only 2 kg has already been developed using a color 33Mpixel CMOS image sensor. However, a conventional single-chip camera has a lower image quality than a full-resolution camera because the total pixel count of the single-sensor camera is only one-third of that of a three-sensor camera, and pixel interpolation is required to configure a full-resolution image. In this example, a 133Mpixel sensor that can be operated at 60 fps to realize a full-resolution 8K single-chip camera is described. To achieve both high speed and suitable ADC resolution, 32-column multiplexing analog readout circuitry and 14b high-speed redundant successive approximation register (SAR) ADCs are adopted in the design. As a result, a full-size image with a data rate of 128.71 Gb/s at 60 fps has been captured.

The total pixel array size is 15488(H)×8776(V) including optical black pixels. The pixel design is a 2.45 μm two-way vertically shared pinned photodiode. The readout of the array is addressed one physical pixel row at a time with 15,488 readout columns split between the top and bottom of the pixel array. The column readout circuit consists of a source-follower bias current (VLN), a programmable-gain amplifier (PGA), and two sets of sample-and-hold capacitor banks (SHCaps) for even-and-odd-row ping-pong operation. Analog data stored in the SHCaps are read out in parallel by 484 SAR-ADCs. Each SAR-ADC serially multiplexes 32 columns, and the resulting converter data are written into the SRAM line memory. Two banks of SRAM memory are used to provide pipelining of the ADC and SRAM readout to reduce the row time. The SRAM readout is further divided into 16 parallel ports to reduce the data rate. Each readout port outputs 960 columns, with the exception of the 4 edge corner ports that output an additional 32 optical black columns. CML output drivers are used to output 7b-wide data to a 574.56 MHz DDR, achieving an aggregate data rate of 128.71 Gb/s. On-chip timing control logic is used.

Front-end multiplexing of the columns is optimized for 32 columns per CMR and a 14b SAR-ADC with a conversion rate of 17.95 Ms/s. To realize this conversion rate with 484 simultaneous ADCs operating in parallel, a 1.85-radix redundant SAR architecture with 12b resolution is chosen. This radix relaxes the ADC reference-settling requirement and also allows for sufficient digital redundancy in the output code to relax the capacitor-matching requirement. The signal readout path in is repeated 16 times with 8 on the top and 8 on the bottom.

I/O pads are provided in every port, thereby minimizing the resistive path to the off-chip low-ESR capacitors, which are required to supply the necessary large transient currents. This significantly reduces the horizontal routing height requirement to each port and enables scalability in the design. The reference and power are routed between the SRAM memory blocks and into the SAR-ADC array. The remaining reference and power for the lower-speed PGA, SHCaps, and CMR are distributed horizontally to each side of the sensor. The reference and supply layout busses are sized to meet supply drooping and settling requirements.

The sensor of this Example 1 comprises the shared capacitor design described in FIG. 3. Within a row period, the ADC performs up to 33 conversions at a data rate of 17.95 MS/s. The ADC timing is clocked with a 287.28 MHz clock, requiring 16 clock cycles to perform the conversion. First, two clock cycles are reserved for the CMR, and the remaining 14 clock cycles are for the ADC bit cycle.

The measured ADC readout noise at 60 fps is 3.52e– at a PGA gain setting of 3× and 1.53e– at a PGA gain setting of 18×. The sensor has an effective resolution of 133Mpixels at 60 fps, progressively scanned. The total random noise is measured to be 7.68e– (PGA gain 2×), and a saturation signal of 10005e– results in a dynamic range of 62.3 dB.

All patents, patent applications, and publications cited in this specification are herein incorporated by reference to the same extent as if each independent patent application, or publication was specifically and individually indicated to be incorporated by reference. The disclosed embodiments are presented for purposes of illustration and not limitation. While the invention has been described with reference to the described embodiments thereof, it will be appreciated by those of skill in the art that modifications can be made to the structure and elements of the invention without departing from the spirit and scope of the invention as a whole.

The invention claimed is:

1. A circuit comprising
a fully differential amplifier comprising a first and a second input line and a first and a second output line, the first and second output lines being branched, each such output line having a first branch and a second branch;
a pair of capacitors comprising a first and a second capacitor, each such capacitor comprising a first and a second plate;
a first and a second voltage source, each comprising an output line;
a third and fourth voltage source, each comprising an output line
an analog to digital converter comprising two inputs; wherein
the first branch of the first output line is connected to the first plate of the first capacitor;
the second plate of the first capacitor is connected to the first input line of the amplifier;
the output line of the first voltage source is connected to the first plate of the first capacitor across a switch;
the output line of the third voltage source is connected to the second plate of the first capacitor across a switch;
the second branch of the first output line is connected to the first input of the analog to digital converter;
the first branch of the second output line is connected to the first plate of the second capacitor across a switch;
the second plate of the second capacitor is connected to the second input line of the amplifier;
the output line of the second voltage source is connected to the first plate of the second capacitor;
the second branch of the second output line is connected to the second input of the analog to digital converter; and
the second plate of the second capacitor is connected to the fourth voltage source across a switch.

2. The circuit of claim 1, wherein
the first and second voltage sources are the two differential voltage outputs of a digital to analog converter.

3. The circuit of claim 1, wherein the first plate of the first capacitor is connected to a first sample and hold capacitor and the first plate of the second capacitor is connected to a second sample and hold capacitor.

4. The circuit of claim 3, wherein
the first and second sample and hold capacitors are connected to pixel output lines and store the photointegration and reset signals output from a pixel.

* * * * *